(12) United States Patent
Rasmussen

(10) Patent No.: US 11,005,027 B2
(45) Date of Patent: May 11, 2021

(54) HIGHLY CONTROLLABLE ELECTROACTIVE MATERIALS AND ELECTROACTIVE ACTUATORS CAPABLE OF PRONOUNCED CONTRACTION AND EXPANSION

(71) Applicant: RAS Labs, Inc., Quincy, MA (US)

(72) Inventor: Lenore Rasmussen, Hingham, MA (US)

(73) Assignee: Ras Labs, Inc.

( * ) Notice: Subject to any disclaimer, the term of this patent is extended or adjusted under 35 U.S.C. 154(b) by 256 days.

(21) Appl. No.: 15/782,212

(22) Filed: Oct. 12, 2017

(65) Prior Publication Data

US 2018/0040804 A1 Feb. 8, 2018

Related U.S. Application Data

(63) Continuation-in-part of application No. 14/476,646, filed on Sep. 3, 2014, now Pat. No. 9,853,202.

(51) Int. Cl.

| H01L 41/09 | (2006.01) |
|---|---|
| H01L 41/083 | (2006.01) |
| H01L 41/193 | (2006.01) |
| H01L 41/047 | (2006.01) |
| C08F 220/06 | (2006.01) |
| F03G 7/00 | (2006.01) |

(52) U.S. Cl.
CPC ........ *H01L 41/0926* (2013.01); *C08F 220/06* (2013.01); *F03G 7/005* (2013.01); *H01L 41/047* (2013.01); *H01L 41/0833* (2013.01); *H01L 41/092* (2013.01); *H01L 41/193* (2013.01); *C08F 2800/20* (2013.01)

(58) Field of Classification Search
CPC ...................................... H01L 41/092
See application file for complete search history.

(56) References Cited

U.S. PATENT DOCUMENTS 8,088,453 B1 * 1/2012 Rasmussen ............. F03G 7/005
427/487
9,070,864 B2 * 6/2015 Hayashi .............. H01L 41/0926

* cited by examiner

*Primary Examiner* — Dah-Wei D. Yuan
*Assistant Examiner* — Andrew J Bowman
(74) *Attorney, Agent, or Firm* — WilmerHale/Boston; Deric Geng

(57) ABSTRACT

This invention describes a method for producing highly controllable motion in electroactive materials and electroactive actuators capable of pronounced contraction and expansion, which act as synthetic muscle, tendon, fascia, perimysium, epimysium, and skin that wrinkles, comprising ion-containing, cross-linked electroactive material(s); solvent(s); electrode(s); attachments to levers or other objects; and coating(s). Restriction of movement in undesired direction(s) produces pronounced movement in the desired direction(s). The electroactive material itself or the electroactive actuator may be used individually or grouped to produce movement when activated by electricity. This invention can provide for human-like motion, durability, toughness, speed, and strength. The electroactive materials and electroactive actuators, with highly controllable motion, can be attached to objects and devices to produce motion with no metal pulleys, gears, or motors needed.

20 Claims, 8 Drawing Sheets

HIGHLY CONTROLLABLE ELECTROACTIVE MATERIALS AND ELECTROACTIVE ACTUATORS CAPABLE OF PRONOUNCED CONTRACTION AND EXPANSION

RELATED APPLICATIONS

This application is a continuation-in-part application of U.S. application Ser. No. 14/476,646, filed Sep. 3, 2014, which is hereby incorporated by reference in its entirety.

TECHNICAL FIELD OF THE INVENTION

This invention relates to a method for producing highly controllable motion in electroactive materials and actuators capable of pronounced contraction and expansion, converting electrical energy into mechanical energy in the form of precise controlled movement in desired direction(s), causing said electroactive materials and electroactive actuators to act as highly controllable artificial muscle, synthetic muscle, tendon, human-like skin, and for use with mechanical devices.

BACKGROUND OF THE INVENTION

Actuation is the conversion of one form of energy into another. Electroactive materials convert electrical energy directly into mechanical energy—motion—with no metal pulleys, gears, or motors required. Electroactive materials can be broadly separated into three types of materials: piezoelectric materials, elastomers between two electric plates, and ion-containing materials. Most piezoelectric materials undergo length changes of only a fraction of one percent. The movement from electroactive materials that use an elastomer between two electric plates is visible to the naked eye, however these materials use extremely high voltages, measured in the kilovolt range, and once that type of electroactive material is activated it remains static. With ion-containing electroactive materials, the material itself responds to electricity by movement that is visible to the naked eye, and as long as the electricity is on, these materials typically continue to move. The voltage requirements for ion-containing electroactive materials are much lower than elastomeric electroactive materials, typically less than 100 volts. Historically, ion-containing electroactive materials have had some drawbacks. Many of the ion-containing electroactive polymers are inherently weak materials and, typically being hydrogels, if they dry out then they become hard, brittle, inflexible, and thus electrically unresponsive.

Applicant has previously found that copolymers comprising cross-linked networks of methacrylic acid and 2-hydroxyethyl methacrylate, (PMA-co-PHEMA), cross-linked with cross-linking agents such as ethylene glycol dimethacrylate and 1,1,1-trimethylolpropane trimethacrylate, are superior ionic electroactive materials, with tensile strengths well above the tensile strengths of other ion-containing electroactive materials found in the prior art at that time (U.S. Pat. No. 5,736,590 [1998]). A relatively small amount of electricity caused movement.

TABLE 1

Strengths of some common ion-containing electroactive polymers compared to PMA-co-PHEMA cross-linked networks.

| Material | Tensile Strength (MPa) |
|---|---|
| Poly(acrylamide) gels | 0.03 |
| Poly(vinyl alcohol)-co-poly(acrylic acid) gels | 0.23 |
| Poly(2-hydroxyethyl methacrylate)-co-poly(methacrylic acid) cross-linked networks* | 0.33 |

*0.28 to 0.76 MPa range for these types of materials.

In 2004 and 2005, applicant developed strong electroactive materials that had pronounced responsive movement to electricity, which led to another drawback. If the electroactive material responded quickly with a lot of movement, then the electrodes often detached. If even one electrode detached, then the actuator failed. This challenge was addressed by plasma treating the electrodes to improve the polymer-metal interface, so that the electrodes and the electroactive material would work as a unit, similar to how nerves are integrated into muscle tissue. By plasma treating the electrodes, which are inserted or embedded into the electroactive material, a much better polymer-metal interface could be achieved between the embedded electrodes and the electroactive material as described in applicant's U.S. patent application Ser. No. 11/478,431 and U.S. Pat. No. 7,935,743. A good polymer-metal interface is crucial because the electroactive materials developed by applicant undergo pronounced movement. Applicant has found that by encapsulating or coating the electroactive materials, with embedded electrodes, the actuator can be free-standing, independent of submersion in an electrolytic solution as described by applicant's U.S. patent application Ser. No. 11/478,431 and U.S. Pat. No. 7,935,743.

In 2008, applicant discovered that electroactive materials and electroactive actuators described in U.S. patent application Ser. No. 12/319,804 and U.S. Pat. No. 8,088,453 that used ion-containing electroactive materials and that are produced within a defined range of cross-linking, along with other considerations, such as dilution of the monomer mix, choice of electrolyte, and the configuration of the electrodes, allowed for the preferred movements of contraction. Electroactive polymers in the prior art undergo a variety of movement. The movement of contraction is considered to be an extremely useful movement because of the similarity to movement produced by muscle tissue. U.S. Pat. No. 8,088,453 disclosed compositions of electroactive materials that undergo contraction and electrode configurations that further increase contraction in these electroactive materials and electroactive actuators. A superior method to significantly improve the polymer-metal interface was described, preferably by plasma treating the titanium metal electrodes of the actuators with nitrogen plasma, followed by oxygen plasma or treated individually with either nitrogen plasma or oxygen plasma. By encapsulating or coating the electroactive materials, with embedded electrodes, these actuators can be operational anywhere.

By blending the acetate of methacrylic acid with its suitable associated cation, such as sodium ion, with methacrylic acid and cross-linking, as described in U.S. patent application Ser. No. 13/843,959, the final material did not need an electrolyte post-treatment step, the unnecessary anion (from electrolyte salt) is eliminated from the final material, and the final material is extremely electroactive.

In the instant invention, because of the high electroactivity of these novel materials, other cross-linking strategies, including the use of two or more different cross-linking agents, provided for tough, highly electroactive materials. This can also produce bimodal behavior in electroactive materials, which lends these materials to a variety of biomimetic applications. Since Applicant developed novel highly electroactive materials that underwent such drastic size changes, several strategies were used to keep the actuator together. In addition to plasma treatment, base treatment, etching, or otherwise treating the electrodes, a bending, spiral shaped, or preferably spring-shaped internal embedded electrode greatly improved the durability of the actuator because the metal electrode could flex as the highly electroactive material changed its dimension. For applications where high flexibility of actuation was needed, carbon fibers, carbon weaves, and carbon felts adhered well to these novel highly electroactive materials. By placing the positive electrode inside the highly electroactive material described, and having the negative electrode slightly external to the highly electroactive material, with suitable conduction through conductive solvent, such as distilled water with a slight amount of salt present or water containing metal and other ions, such as tap water, and applying electric input, contraction occurred. When the polarity of the electrodes was reversed, expansion occurred. Contraction and expansion could be cycled repeatedly. Also, at the distal ends of the actuator, where the internal electrode enters the highly electroactive material and where any attachments enter the highly electroactive material, a stronger formulation was provided at the distal ends. This tethered the electrodes and any attachments firmly into place where they entered the highly electroactive material of the highly electroactive actuator. The coating of the highly electroactive actuator could be a bilayer coating, where the inner layer is flexible and conductive, so also served as the slightly external electrode, and the outer layer served to retain moisture of the electroactive material inside, allowing these actuators to be operational anywhere.

In the instant invention, in order to produce fast, highly controllable motion in electroactive materials and electroactive actuators capable of pronounced contraction and expansion, the restriction of motion is paramount in controlling and amplifying the movement in the desired direction(s), producing novel, fast, highly controllable motion, without traditional pulleys, motors, or gears. In the instant invention, the highly controllable motion in electroactive materials and electroactive actuators capable of pronounced contraction and expansion can provide for a wide variety of actuation, such as rotational actuation(s), linked actuation(s), and haptic actuation(s), without traditional pulleys, motors, or gears. Producing movement of objects and devices using this novel method is challenging because of the large deformations that the electroactive materials undergo—pronounced contraction or expansion—when electrically activated. The instant invention describes how these challenges are met and the method to produce novel, extremely controllable, life-like motion of electroactive materials and electroactive actuators capable of pronounced contraction and expansion at low voltages with low heat and noise signatures, without traditional pulleys, motors, or gears.

The instant invention may revolutionize robots and prostheses by providing highly controllable motion in electroactive materials and electroactive actuators capable of pronounced contraction and expansion, with smooth two and three-dimensional range of motion, good durability, good speed, high strength, and that may operate over a wide variety of environmental conditions. The degree of contraction, and expansion when the polarity is reversed, can be controlled by the restriction of motion in the undesired direction(s) and the voltage level of the electric input, so biofeedback could easily be linked in using these materials and actuators.

SUMMARY OF THE INVENTION

This invention discloses a method for producing said highly controllable motion in electroactive materials and electroactive actuators capable of pronounced contraction and expansion, which act as synthetic muscle, tendons, nerves, and devices where movement is required with the preferred movements of contraction when electricity is applied to the highly electroactive material, or expansion when the electric polarity is reversed. Contraction-expansion can be cycled repeatedly. The instant invention produces fast, highly controllable motion in electroactive materials and electroactive actuators, even at lower voltages, primarily through the restriction of motion in undesired direction(s) in order to control and amplify movement in the desired direction(s).

The objects, advantages, and features of the present invention are readily apparent from the following description of the preferred embodiment for carrying out the invention when taken in connection with the accompanying drawings.

A more complete appreciation of the invention and many of the attendant advantages and features thereof may be readily understood by reference to the following more detailed description of the drawings in which the reference characters indicate corresponding parts in all views and the detailed description.

In one aspect, a method for producing an electroactive material and an electroactive actuator capable of pronounced contraction and expansion made from reactants is described, comprising at least one ion-containing monomer, at least one cross-linking agent with a functionality of 3 or greater, at least one diluent compatible with said ion-containing monomer(s), polymerizing and cross-linking said reactants to produce said electroactive material and said electroactive actuator with at least one conductive electrode, and by controlling and amplifying the direction of movement in one or more desired directions by restricting the movement in the other undesired direction(s) of said electroactive material(s) and said electroactive actuator(s) to produce pronounced contraction and expansion.

In some embodiments, to increase or decrease said pronounced contraction or expansion in a z-direction, the thickness, of said electroactive material or said electroactive actuator, the restriction of movement in the an xy-direction produces less movement in said xy-plane and said pronounced movement in said z-direction.

In some embodiments, to increase or decrease said pronounced contraction or expansion in said xy-direction, the area, of said electroactive material or said electroactive actuator, the restriction of movement in said z-direction produces less movement in the z-direction and said pronounced movement in said xy-plane.

In some embodiments, restriction of movement is maintained by adhering said electroactive material to a firm substrate that doesn't change dimension as much as said electroactive material, from the group comprising carbon fiber weave, metal wire weave, or a plastic, ceramic, or metal base.

In some embodiments, restriction of movement is maintained by selected coating(s), consisting of an elastomeric coating that is more flexible in one or more direction than the other direction(s), preferably a uniaxially stretched elastomeric coating.

In some embodiments, restriction of movement is maintained by the combination of adhering said electroactive material to said firm substrate and said selected coating(s), so that movement is restricted in one or more directions with said pronounced movement in the desired directions(s).

In some embodiments, a combination of controlling both electric input, for example, polarity and voltage levels, and restriction of movement in undesired direction(s), produces control of both the amount of movement and the direction of movement in said electroactive materials and said electroactive actuators capable of said pronounced contraction and expansion.

In some embodiments, because of the high electroactivity of said electroactive materials and said electroactive actuators capable of said pronounced contraction and expansion, cross-linking strategies including the use of two or more different cross-linking agents produces tougher highly electroactive materials that can exhibit bimodal or multi-modal behavior.

In some embodiments, said conductive electrode embedded in said electroactive material is a shaped electrode, selected from the group comprising a spring, bendable electrode, stretchable electrode, nano-fiber, flexible electrode, or shape-changing electrode.

In some embodiments, said electroactive material itself is shaped, preferably spiral shaped, and the embedded conductive electrode is preferably spiral shaped.

In some embodiments, an external electrode near said electroactive material is a shaped electrode, selected from the group comprising a spring, bendable electrode, stretchable electrode, nano-layer, flexible electrode, or shape-changing electrode.

In some embodiments, said electroactive materials and said electroactive actuators capable of said pronounced contraction and expansion are miniaturized and so are very small, even microscopic or nano-scale miniaturized actuators, in order to produce extremely fast contraction or expansion.

In some embodiments, said electroactive materials and said electroactive actuators capable of said pronounced contraction and expansion and the wiring of said electroactive materials and said electroactive actuators capable of said pronounced contraction and expansion are miniaturized and so are very small, even microscopic or nano-scale miniaturized actuators, in order to produce extremely fast contraction or expansion.

In some embodiments, said electroactive materials and said electroactive actuators capable of said pronounced contraction and expansion, said wiring, and coating(s) of said electroactive materials and said electroactive actuators capable of said pronounced contraction and expansion are miniaturized and so are very small, even microscopic or nano-scale miniaturized actuators, in order to produce extremely fast contraction or expansion.

In some embodiments, voltage level is very low and can still produce rapid movement in said miniaturized actuators.

In some embodiments, alternating current can be applied to said miniaturized actuators to produce very rapid contraction and expansion cycles.

In some embodiments, said miniaturized actuators are bundled together to form larger actuators that are capable of very fast, very strong, very energy efficient, controllable contraction and expansion.

In some embodiments, shaped current input, selected from the group comprising spiked, pulsed, saw-tooth, or step wave functions, can be optimized to produce greater control and greater energy efficiency in said electroactive materials and said electroactive actuators.

In some embodiments, wherein a fuel cell can be tied in with said electroactive material and said electroactive actuator capable of said pronounced contraction and expansion for even greater energy efficiency.

In some embodiments, said electroactive materials and said electroactive actuators capable of said pronounced contraction and expansion are used to produce extremely life-like biomimetic linked actuation.

In some embodiments, two links, forming an X shape, are actuated using two actuators comprising said electroactive materials capable of said pronounced contraction and expansion, wherein both actuators are arranged on opposite sides of the X-shaped joint, working together, both either contracting or expanding with electric input, to respectively bring the links closer together or farther apart, and the electric polarity of the actuators can be reversed to easily produce the opposite linked motion.

In some embodiments, two links, forming an X shape, are actuated using four actuators using said electroactive materials capable of said pronounced contraction and expansion, wherein all four actuators are arranged around the X-shaped joint, wherein actuators arranged opposite from one another work together, for example, contracting, and actuators adjacent to one another work in the opposite mode, for example, expanding, so that the links move faster and with greater strength compared to using only two actuators as described herein, and to move the links quickly farther apart, the electric polarity of the actuators is reversed.

In some embodiments, said actuators comprising said electroactive materials capable of said pronounced contraction and expansion are arranged around an elbow-like hinge joint, wherein antagonistic pairing is preferably present, wherein contraction or expansion by the actuator(s) on the acute angle side of said joint brings the links respectively closer together or farther apart, and contraction or expansion by the actuator(s) on the obtuse angle side of said joint brings the links respectively farther apart or closer together.

In some embodiments, said actuators comprising said electroactive materials capable of said pronounced contraction and expansion are arranged around a ball-and-socket joint, also called a universal joint, wherein three or more actuators are arranged equally spaced around said ball-and-socket joint, and can operate two or more links attached to said ball-and-socket joint, operating singly or together in contraction and expansion modes, controllably providing a large degree of motion.

In some embodiments, said actuators comprising said electroactive materials capable of said pronounced contraction and expansion are combined using said elbow-like hinge joint(s), said ball-and-socket joint(s), rotational actuation(s), and push-pull actuation(s), singly, multiple times, or not including all forms of actuation, to produce a wide variety of controllable motion with varied degrees of motion.

In some embodiments, said electroactive materials and said electroactive actuators capable of said pronounced contraction and expansion are coated or encapsulated so that they can be operational anywhere, preferably with an elastomeric silicone coating.

In some embodiments, said electroactive based materials and said electroactive actuators capable of said pronounced contraction and expansion can be used for prostheses, for example, making extremely life-like prostheses in function, tactility, and appearance, with or without biofeedback.

In some embodiments, said electroactive materials and said electroactive actuators capable of said pronounced contraction and expansion can be used for robots, for example, making very human-like robots in function, tactility, and appearance.

In some embodiments, a porous pouch can contain said electroactive materials capable of said pronounced contraction and expansion, where solvent can flow freely in and out of said pouch, and said electroactive material is preferably in small particulate pieces.

In some embodiments, single or multiple said porous pouches containing said electroactive materials capable of said pronounced contraction and expansion, preferably with each pouch independently wired, are arranged in a variety of ways to provide a wide range of movement when electrically activated.

In some embodiments, a cylinder or ball can be controllably rotated back and forth by placing said cylinder on top of a stiff material, such as a glass slide, where the stiff material is on top of at least two said porous pouches comprising said electroactive materials capable of said pronounced contraction and expansion, which makes the stiff material act as a lever when said porous pouches containing said electroactive material are electrically activated, preferably with one pouch contracting while the other pouch is expanding, thereby rotating the cylinder or ball.

In some embodiments, shapes that can undergo rotational actuation using said porous pouches comprising said electroactive materials and said electroactive actuators capable of said pronounced contraction and expansion include, are selected from the group comprising cylinders, spheres, balls, ovoids, ellipsoids, cones, hyperboloids, and toroids.

In some embodiments, said electroactive materials and said electroactive actuators capable of said pronounced contraction and expansion are coated or encapsulated so that they can be operational anywhere, preferably with an elastomeric silicone coating.

In some embodiments, electric input can be supplied by a battery or by batteries, preferably with more than one battery aligned in series.

In some embodiments, the direction and speed of actuation, the ability to stop actuation, and to start actuation again, can be controlled remotely.

In some embodiments, a film of said electroactive materials and said electroactive actuators capable of said pronounced contraction and expansion can be used as a shape-morphing surface, for example, for reversible braille displays or haptic screens, or to create changeable dimpled surfaces or otherwise shaped surfaces, for example, to change the surfaces on aircraft or naval vessels, or to create synthetic skin, for example, that can form the appearance cutis anserina, also called goose bumps, in cold weather.

In some embodiments, said electroactive materials and said electroactive actuators capable of said pronounced contraction and expansion can be used for drug delivery purposes during controlled contraction or expansion, preferably with biofeedback.

In some embodiments, said electroactive materials and said electroactive actuators capable of said pronounced contraction and expansion can controllably contract or expand from changes in pH, with or without electric input.

In some embodiments, said electroactive materials and said electroactive actuators capable of said pronounced contraction and expansion can controllably contract or expand from changes in electrolyte concentration, with or without electric input.

In some embodiments, said electroactive materials and said electroactive actuators capable of said pronounced contraction and expansion, in the shape of a cylinder, tube, or other shape, can be used in the contracted mode for very easy and comfortable placement in orifices, for example, for urinary catheterization, hearing aid insertion and removal, heart stent(s), and heart stent placement(s).

In some embodiments, said electroactive materials and said electroactive actuators capable of said pronounced contraction and expansion, in the shape of a cylinder, tube, or other shape, after being fitted into place, can be expanded to fit the desired orifice, and then contracted again for easy removal, for example, for an urinary catheter, hearing aid, heart stent, or heart stent placement device.

In some embodiments, said electroactive materials and said electroactive actuators capable of said pronounced contraction and expansion can be produced in a variety of shapes and sizes using three-dimensional printing.

In some embodiments, tiny fibers of said electroactive materials and said electroactive actuators capable of said pronounced contraction and expansion can be produced using electro-spinning and nanotechnology.

In another aspect, an actuation device for rotating an object is described, including:

a first actuation zone comprising a first electroactive material;

a first electrode in electronic communication with the first electroactive zone;

a second actuation zone comprising a second electroactive material; and a second electrode in electronic communication with the second electroactive zone and the first electrode;

wherein the first and second actuation zones are each in contact with the object to be rotated and configured to exert a force on the object upon actuation; and the first and second electroactive materials are the same or different materials each selected to be capable of pronounced contraction and expansion.

In some embodiments, the first and second electroactive materials each comprises at least one ion-containing monomer cross-linked by at least one cross-linking agent having a functionality of 3 or greater and at least one diluent compatible with the ion-containing monomer.

In some embodiments, the first electroactive material is adhered to the first electrode which does not change dimension as much as the first electroactive material to restrict its movement in one or more undesired directions to amplify its movement in one or more desired directions; or the first actuation zone further comprises an elastomeric coating more flexible in one or more desired directions than one or more other undesired directions and covering the first electroactive material to restrict its movement in undesired directions to amplify its movement in the one or more desired directions.

In some embodiments, the second electroactive material is adhered to the second electrode which does not change dimension as much as the second electroactive material to restrict its movement in one or more undesired directions to amplify its movement in one or more desired directions; or the second actuation zone further comprises an elastomeric coating more flexible in one or more desired directions than one or more other undesired directions and covering the first electroactive material to restrict its movement in undesired directions to amplify its movement in the one or more desired directions.

In some embodiments, the first and second actuation zones each have a longest dimension along first and second axes, respectively, and the first and second axes are at an angle θ, and 0<θ<180 degree.

In some embodiments, 120<θ<180 degree.

In some embodiments, the first electrode is a positive electrode and the second electrode is a negative electrode.

In some embodiments, the first electrode is a negative electrode and the second electrode is a positive electrode.

In some embodiments, the first and/or second electroactive materials are adhered to the first electrode which does not change dimension as much as the first electroactive material to restrict its movement in one or more undesired directions to amplify its movement in one or more desired directions.

In some embodiments, the first and/or second actuation zones further comprise an elastomeric coating more flexible in one or more desired directions than one or more other undesired directions and covering the first electroactive material to restrict its movement in undesired directions to amplify its movement in the one or more desired directions.

In some embodiments, the elastomeric coating is an uniaxially stretched silicone film.

In some embodiments, the first and/or second electrodes are inserted, embedded, or arranged into the first and/or second actuation zones, respectively.

In some embodiments, the object is a cylinder or a ball.

In some embodiments, the first and/or second actuation zones are configured to be attached to the object.

In some embodiments, the first and/or second actuation zones are configured to be attached to the object by adhesives or string.

In some embodiments, the voltages of the first and second electrodes are configured such that when the first electroactive material contracts, the second electroactive material expands, and when the first electroactive material expands, the second electroactive material contracts.

In some embodiments, the first and/or second electroactive materials have a shape selected from the group consisting of spherical, cylindrical, conical, pyramidal, prism-shaped, spheroid, ellipsoid, cubical, rectangular prism-shaped, toroid, parallel-epiped-shaped, rhombic prism-shaped, and any combination thereof.

In some embodiments, the first and/or second actuation zones have a shape selected from the group consisting of spherical, cylindrical, conical, pyramidal, prism-shaped, spheroid, ellipsoid, cubical, rectangular prism-shaped, toroid, parallel-epiped-shaped, rhombic prism-shaped, and any combination thereof.

In some embodiments, the first and/or second actuation zones further comprise a solvent, an electrolyte solution, an electrolyte gel formulation, carbon particles, fibers, weaves, felts, nano-particles, nano-tubes, or metal ions.

In some embodiments, the actuation device further includes one or more additional actuation zones each comprising an electroactive material comprising at least one ion-containing monomer cross-linked by at least one cross-linking agent having a functionality of 3 or greater.

In another aspect, a method for rotating an object is described, including:

providing the actuation device described in any embodiment disclosed herein;

placing an object to be rotated in contact with the first and second actuation zones; and actuating the first and second electroactive materials to rotate the object.

In some embodiments, the method further includes controlling the voltages of the first and second conductive electrodes to contract one of the first and second electroactive materials and expand the other to rotate the object.

In some embodiments, the method further includes attaching the first and/or second actuation zones to the object.

In some embodiments, the first and/or second actuation zones are configured to be attached to the object by adhesives or string.

In some embodiments, the method further includes reversing the electric polarity of the first and second conductive electrodes to rotate the object in the opposite direction.

In some embodiments, the method further includes controlling the electric polarity and the amount of electric input of the first and second conductive electrodes to control the speed of the objection rotation.

SOURCES OF SUPPLY

Methacrylic acid can be purchased from Sigma-Aldrich, St. Louis, Mo., Monomer-Polymer Dajac Laboratories, Inc., Feasterville, Pa., and other suppliers. Poly(ethylene glycol) dimethacrylate and other cross-linking agents can be purchased from Sigma-Aldrich, St. Louis, Mo., Monomer-Polymer Dajac Laboratories, Inc., Feasterville, Pa., and other suppliers. The highly electroactive materials are produced using standard free radical polymerization or photopolymerization methods. Light activated initiators, such as 1-hydroxycyclohexyl phenyl ketone or phenylbis(2,4,6-trimethylbenzoly)phosphine oxide, can be purchased from BASF, Sigma-Aldrich, and other suppliers. Thermally activated initiators, such as 2,2'-azodiisobutyronitrile or benzoyl peroxide, can be purchased from Sigma-Aldrich, and other suppliers. Titanium based materials may be purchased from ESPI Metals, Ashland, Oreg., Dynamet, a subsidiary of Carpenter Technology Corporation, Washington, Pa., and other suppliers. Corrosion resistant stainless steel may be purchased from McMaster-Carr, Atlanta, Ga., Carpenter Technology Corporation, Reading, Pa., and other suppliers. Carbon fibers, weaves, and felts can be purchased from ACP Composites, Livermore, Calif., and other suppliers. Carbon black can be purchased from Cabot Corporation, Billerica, Mass., and other suppliers. The coating(s) for the actuator may comprise natural rubber, poly(butadiene), poly(vinylidene chloride), poly(vinyl chloride), silicones, selected polyurethanes, Pliobond®, Press'n Seal® wrap, Tesa Tape®, VHB tape, shrink-wraps, or other elastomers, or combination of materials.

DESCRIPTION OF THE DRAWINGS

Figure 1:
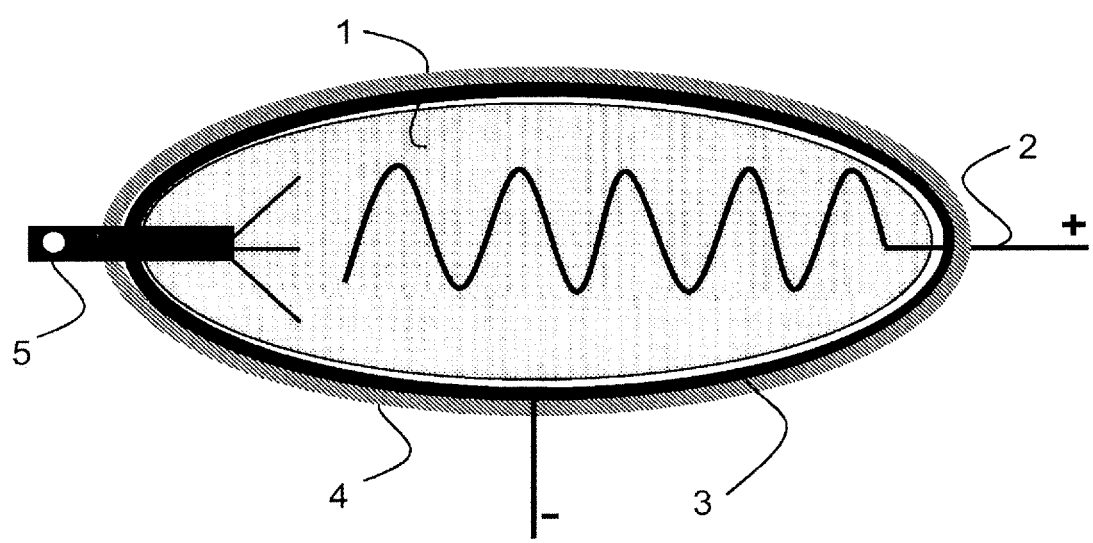
FIG. 1 is a perspective view of a highly electroactive actuator with an attachment and a bendable embedded electrode.

A more complete appreciation of the invention and many of the attendant advantages and features thereof may be readily understood by reference to the following description of the drawings in which the reference characters indicate corresponding parts in all views and the detailed description.

FIG. 1 shows a highly electroactive actuator, where 1 is the highly electroactive material, 2 is the embedded, preferably bendable or stretchable positive electrode and 3 is the negative electrode, which is also the inner layer of a bilayer coating. The ends of the electrode can be splayed, untwisted, or arranged into filaments, meshes, nets, wires, or fibers, and inserted or embedded in the highly electroactive material 1. The highly electroactive material 1, with or without electrodes, can be encapsulated by a bilayer flexible coating, where the inner layer 3 serves as the negative electrode, and the flexible outer layer 4 of the bilayer coating retains moisture of the highly electroactive material 1, which allows for the electroactive actuator to be operational anywhere. The attachment 5 can connect to other objects to produce work. The distal ends of the highly electroactive material 1 where the positive electrode 2 and attachment 5 enter the highly electroactive material are preferably a different formulation, with much higher cross-linking, than the more central electroactive area of the highly electroactive material 1. The electrodes in this depiction deliver the electric impulse and can also be attached to levers or other objects, independently or in conjunction with other fibers, to produce movement or work when the highly electroactive actuator is activated by electricity, when the highly electroactive actuator relaxes or returns to its original conformation after the electricity is stopped, when the polarity of the electrodes is reversed, or a combination of movements from activation and relaxation or from reversing the polarity of the electrodes.

Figure 2:
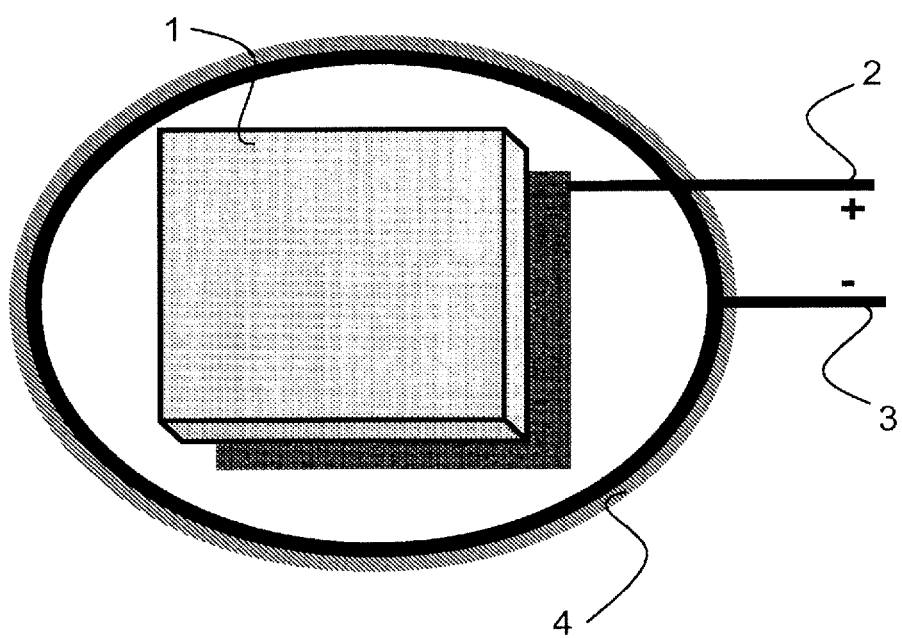
FIG. 2 is a perspective view of a highly electroactive actuator with restriction of movement in area, allowing for a greater degree of movement in thickness.

FIG. 2 shows a highly electroactive actuator, where the highly electroactive material 1 is backed by a conductive electrode 2, such as a carbon weave, which also restricts direction of the highly electroactive material 1 in the xy-direction (area). The highly electroactive material 1, with or without electrodes, can be encapsulated by a bilayer flexible coating, where the inner layer 3 serves as the negative electrode, and the flexible outer layer 4 of the bilayer coating retains moisture of the highly electroactive material 1, which allows for the electroactive actuator to be operational anywhere. By restricting movement of the electroactive material 1 in the xy-direction (area), faster more pronounced movement is produced in the direction (thickness). The electrodes in this depiction deliver the electricity to produce movement or work when the highly electroactive actuator is activated by electricity, when the highly electroactive actuator relaxes or returns to its original conformation after the electricity is stopped, when the polarity of the electrodes is reversed, or a combination of movements from activation and relaxation or from reversing the polarity of the electrodes.

Figure 3:
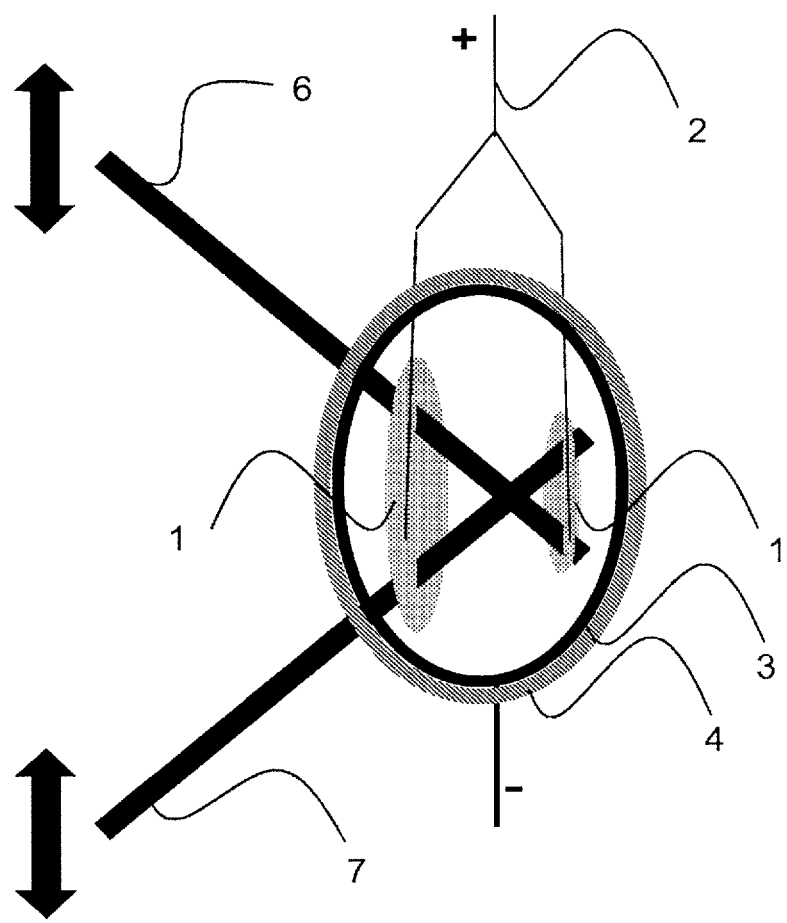
FIG. 3 is perspective view of a highly electroactive actuator using two highly electroactive material zones attached to two links operating around a simple X-shaped hinge joint.

FIG. 3 shows a highly electroactive actuator, where 1 is the highly electroactive material arranged in two zones, where the positive electrode 2 is inserted, embedded, or arranged in both zones of the highly electroactive material 1, where the negative electrode 3 is an inner layer of a bilayer coating placed near the highly electroactive material 1, however, the negative electrode 3 can also be inserted in the highly electroactive material 1. The highly electroactive material 1, with or without electrodes, is encapsulated by a flexible coating 4, preferably the outer layer of a bilayer coating. Levers 6 and 7, also called links, are attached to the highly electroactive actuator. The levers operate around a simple hinge-like joint. For linked actuation, when the highly electroactive actuator is activated by electricity and the highly electroactive material contracts, the levers move closer together. When the highly electroactive actuator relaxes after the electricity is stopped or when the polarity of the electrodes is reversed and the highly electroactive material expands, the levers move farther apart. A combination of movements from activation, relaxation, and from reversing the polarity of the electrodes can be used.

Figure 4:
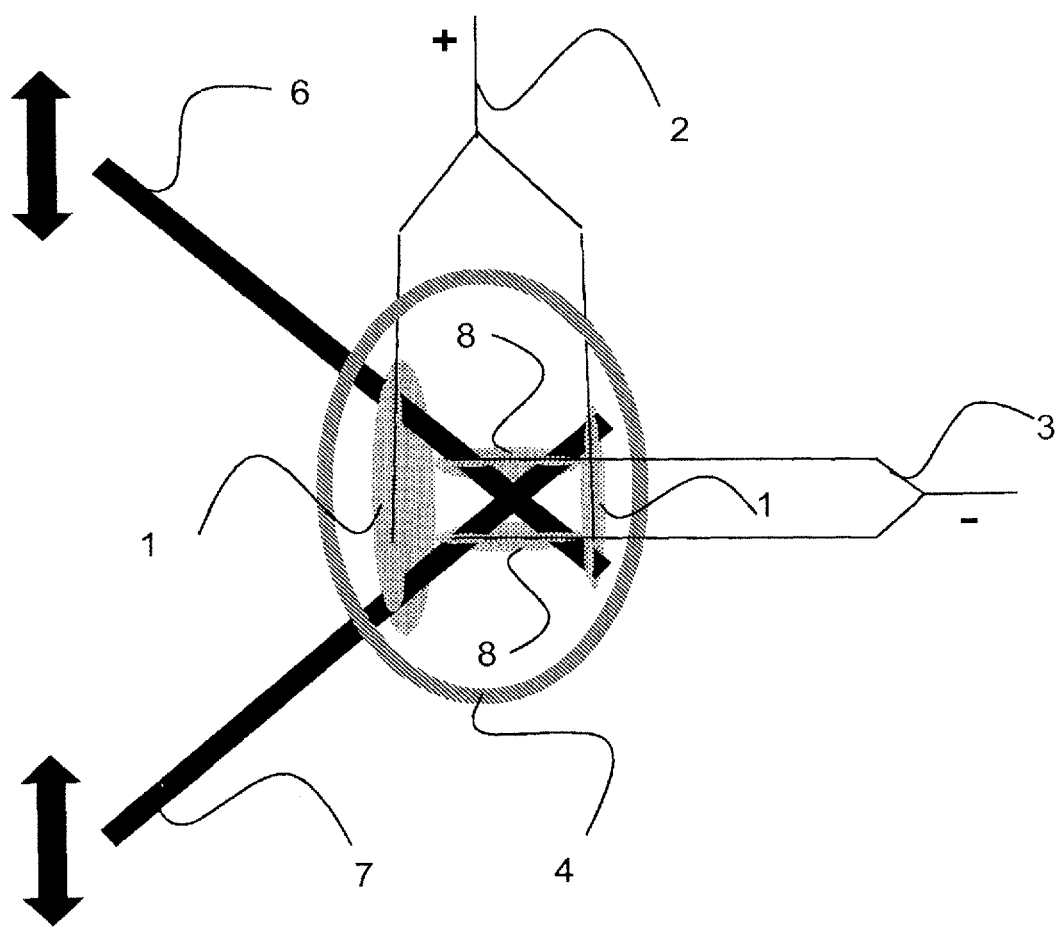
FIG. 4 is a perspective view of a highly electroactive actuator using four highly electroactive zones attached to two links operating around a simple X-shaped hinge joint.

FIG. 4 shows a highly electroactive actuator, where 1 is the highly electroactive material arranged in four zones, where the positive electrode 2 is inserted, embedded, or arranged in both zones of the highly electroactive material 1, where the negative electrode 3 is inserted, embedded, or arranged in both zones of the highly electroactive material 8. The highly electroactive materials, with or without electrodes, is encapsulated by a flexible coating 4. Levers 6 and 7, also called links, are attached to the highly electroactive actuator. The levers operate around a simple hinge-like joint. For linked actuation, when the highly electroactive actuator is activated by electricity and the highly electroactive material zones 1 contract while the highly electroactive material zones 8 expand, the levers move closer together. When the highly electroactive actuator relaxes after the electricity is stopped or when the polarity of the electrodes is reversed and the highly electroactive material zones 1 expand while the highly electroactive material zones 8 contract, the levers move farther apart. A combination of movements from activation, relaxation, and from reversing the polarity of the electrodes can be used.

Figure 5:
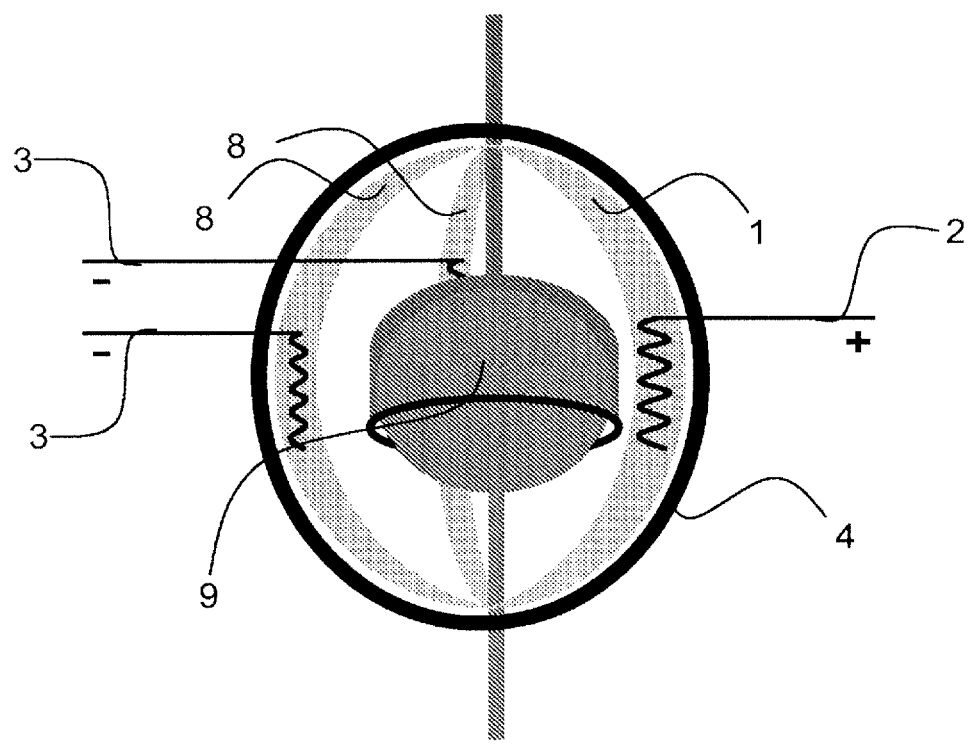
FIG. 5 is a perspective view of a highly electroactive actuator using three highly electroactive zones attached to a universal joint, also called a ball-and-socket joint.

FIG. 5 shows a highly electroactive actuator, where 1 is the highly electroactive material arranged in a minimum of three zones, where the positive electrode 2 is inserted, embedded, or arranged in at least one zone of the highly electroactive material 1, where the negative electrode 3 is inserted, embedded, or arranged in at least one zone of the highly electroactive material 8. The highly electroactive materials, with or without electrodes, is encapsulated by a flexible coating 4. The universal joint 9 is attached to the highly electroactive actuator. The polarity and amount of electric input provides for a wide range of movement and good control using a universal joint. A combination of movements from activation, relaxation, and from reversing the polarity of the electrodes can be used.

Figure 6:
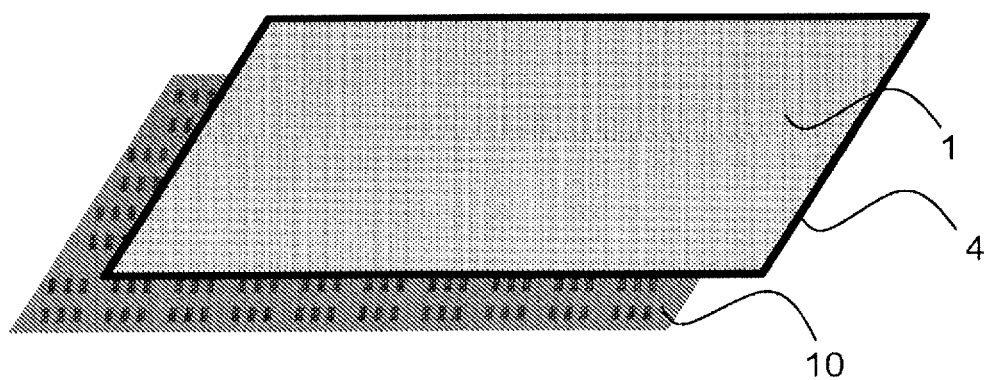
FIG. 6 is a perspective view of the highly electroactive material film as a shape-morphing surface.

FIG. 6 shows a highly electroactive shape-morphing surface, where the highly electroactive material 1 is arranged as a film, with a flexible coating 4, preferably covering the top and sides of the film, and 10 is an electronic circuit grid board for providing defined electric input to desired areas of the highly electroactive material 1, preferably using the expansion mode so that the highly electroactive material in desired areas expands and raises above the surface. This shape-morphing surface can be changed by simply changing the pattern provided from the electronic circuit grid underneath the electroactive material 1. This invention provides for an easy, energy efficient way to make tactile haptic pads and screens, such as Braille electronic readers and no-light, quiet communication for night missions. This invention can also be used for shape-morphing surfaces, such as for vehicles on land, water, air, and space.

Figure 7:
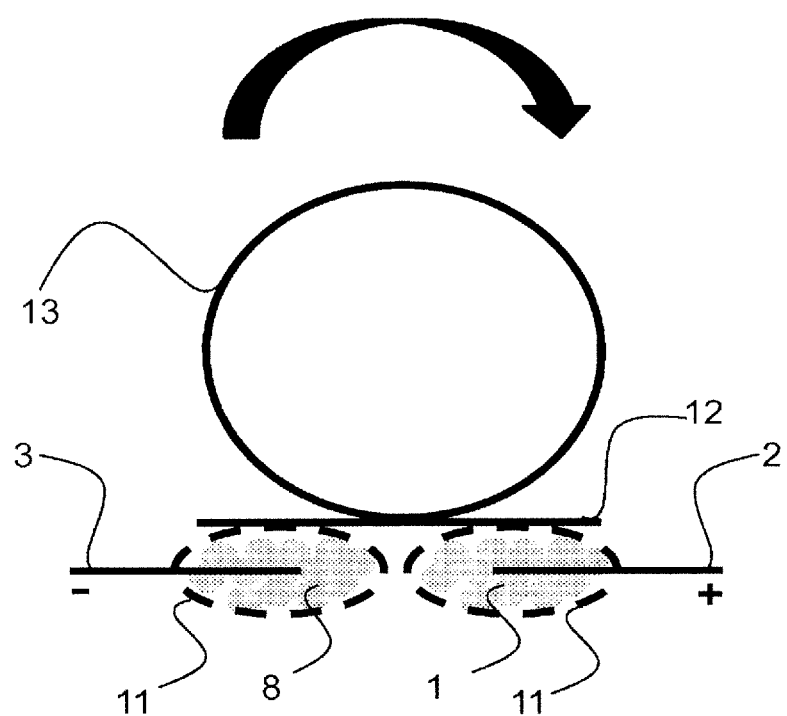
FIG. 7 is a perspective view of two highly electroactive pouches rotating a cylinder.

FIG. 7 shows a highly electroactive actuator, where 1 is the highly electroactive material arranged within two gel pouches 1 and 8, and where the electroactive material 1 and 8 can be beads or particles. The positive electrode 2 is inserted, embedded, or arranged in at least one gel pouch 1 and the negative electrode 3 is inserted, embedded, or arranged in at least one other gel pouch 8. The gel pouches containing highly electroactive materials, with or without electrodes, is encapsulated by a porous coating 11, which allows the passage of solvent(s) and gases, but not of the highly electroactive material, beads, or particles. Above the gel pouches is a rigid lever 12. On top of the rigid lever 12 is a cylinder (or ball) 13. When the gel pouches are activated, one pouch contracts while the other pouch expands, causing the lever to slant downwards on one side and upwards on the other, like a seesaw, causing the cylinder to rotate. When the electric polarity is reversed, the cylinder rotates in the opposite direction. Electric activation, relaxation, and reversing the polarity of the electrodes can be used to control the rotational actuation.

The actuators comprising highly electroactive materials shown in FIG. 1, FIG. 2, FIG. 3, FIG. 4, FIG. 5, FIG. 6, and FIG. 7 may be used as highly controllable electroactive actuators. The highly electroactive material(s) can be spherical, cylindrical, conical, pyramidal, prism-shaped, spheroid, ellipsoid, cubical, rectangular prism-shaped, toroid, parallelepiped-shaped, rhombic prism-shaped, or any combination thereof. In FIG. 1, FIG. 2, and FIG. 3, the negative electrode may be part of the coating or incorporated into the coating. In FIG. 1, FIG. 2, FIG. 3, FIG. 4, FIG. 5, FIG. 6, and FIG. 7, the electrodes may be plasma treated, etched, or otherwise treated, and may be shaped, such as spiral or spring-shaped electrodes, and may be flexible, bendable, or stretchable. The highly electroactive material itself or highly electroactive actuator may be used individually or grouped together in fibers, bulk, slabs, or bundles, to hinge joints, rotator (ball-and-socket) type joints, other hinges, other joints, valves, catheters, stents, levers, or other objects. Alternatively or in addition to solvent, electrolyte solution or electrolyte gel formulation, carbon particles, fibers, weaves, felts, nano-particles, or nano-tubes, metal ions, or any other electrically conductive material, may be present in the highly electroactive material to enhance electroactivity. A higher cross-link density formulation can be used in the distal regions of the electroactive material where the electrode(s) or any attachment(s) enter the electroactive material. Adhesive can be applied to the areas where the electrodes or fibers protrude from the coating to provide additional strength and to prevent leakage.

The universal joint is also known as a ball-and-socket joint. Highly electroactive materials and actuators, when attached to a universal joint, preferably with three or more highly electroactive material zones or independent highly electroactive actuators, allows for a large range of motion. Devices with multiple levers, also known as links, using both simple levered hinge joints and universal joints, can produce a variety of prosthetic and robotic devices, allowing for life-like prosthetic and humanoid robotic designs, in addition to other designs. Any reference to x, y, z directionality are well-known mathematical terms with conventional meaning in math, graphs, charts, designs, diagrams, and projections.

Figure 8:
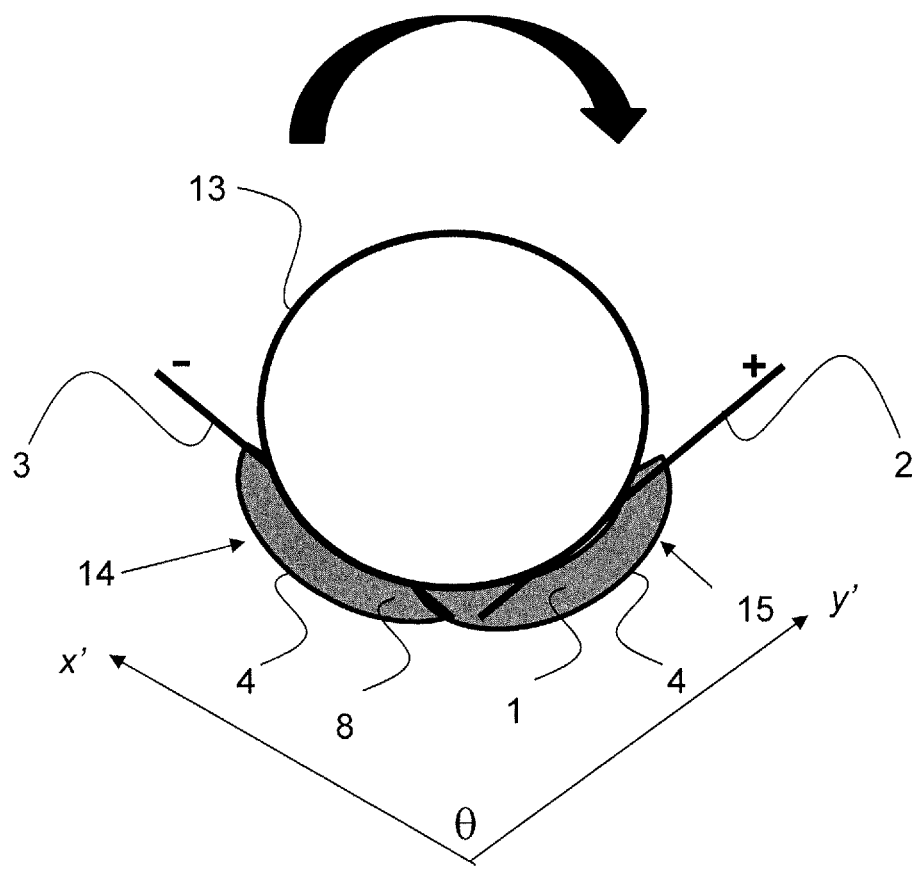
FIG. 8 is a perspective view of a highly electroactive actuator using 2 highly electroactive material zones directly attached to a cylinder for rotational actuation.

FIG. 8 shows a highly electroactive actuator, where 1 and 8 are the same or different highly electroactive materials arranged within two actuation zones 14 and 15. The positive electrode 2 is inserted, embedded, or arranged into zone 1 of the highly electroactive material and the negative electrode 3 is inserted, embedded, or arranged into zone 5 of the highly electroactive material. The electroactive material, with or without electrodes, is encapsulated by a flexible coating 4, preferably uniaxially stretched silicone film. The actuator is directly attached to a cylinder (or ball) 13, with adhesive(s) or by tying the actuator tightly in place on the cylinder, for example, with a cord such as a wire or a string. The actuator can be operated to provide rotational motion. For example, voltage inputs to the electrodes in zones 14 and 15 can be selected to cause the highly electroactive materials in the respective zones to expand or contract. When the highly electroactive actuator is activated, one zone contracts while the other zone expands, causing the cylinder to rotate in a first direction. When the electric polarity is reversed, the cylinder rotates in the direction opposite the first direction. Electric activation, relaxation, and reversing the polarity of the electrodes can be used to control the rotational actuation.

The actuators comprising highly electroactive materials shown in FIG. 8 may be used as highly controllable electroactive actuators. The highly electroactive material(s) can be provided in a variety of shapes and geometries, such as spherical, cylindrical, conical, pyramidal, prism-shaped, spheroid, ellipsoid, cubical, rectangular prism-shaped, toroid, parallelepiped-shaped, rhombic prism-shaped, or any portions thereof or any combination thereof. By way of example, the electroactive material in FIG. 8 is provided in a half spheroid shape. In FIG. 8, the electrodes may be plasma treated, etched, or otherwise treated, and may be shaped, such as spiral or spring-shaped electrodes, and may be flexible, bendable, or stretchable. The actuation zones containing the highly electroactive material may be used individually or grouped together in fibers, bulk, slabs, or bundles, to hinge joints, valves, catheters, stents, levers, or other objects. Alternatively or in addition, solvent, electrolyte solution or electrolyte gel formulation, carbon particles, fibers, weaves, felts, nano-particles, or nano-tubes, metal ions, or any other electrically conductive material, may be present in the highly electroactive material to enhance electroactivity. A higher cross-link density formulation can be used in the distal regions of the electroactive material where the electrode(s) or any attachment(s) enter the electroactive material. Adhesive can be applied to the areas where the electrodes or fibers protrude from the coating to provide additional strength and to prevent leakage.

In some embodiments, the actuator can be designed to provide anisotropic, or non-uniform, actuation. For example, movement, e.g., expansion, of an actuator can be constrained in one direction, so that the actuation force in the constrained direction is muted or prevented. In one or more embodiments, the electroactive material can be adhered to the electrode which does not change dimension as much as the electroactive material to which it is attached, resulting in a restriction of its movement in one or more undesired directions to amplify its movement in one or more desired directions. For instance, as shown in FIG. 2, when the highly electroactive material 1 is adhered to the conductive electrode 2, the adhesion restricts the movement of the highly electroactive material 1 in the xy-direction (area) and thus amplifies its movement in the z direction. In some embodiments, the first and/or second actuation zones further comprises an elastomeric coating more flexible in one or more desired directions than one or more other undesired directions and covering the first electroactive material to restrict its movement in undesired directions to amplify its movement in the one or more desired directions.

In some embodiments, as shown in FIG. 8, the first and second actuation zones 14 and 15 each have a longest dimension along a first and second axes x' and y', respectively, and the first and second axes are at an angle θ, and $0 \leq \theta \leq 180$ degree. In some embodiments, $0 < \theta < 180$ degree. In some embodiments, $120 < \theta < 180$ degree.

LIST OF REFERENCE NUMERALS

1—highly electroactive material, preferably around initial positive electrode
2—positive electrode
3—negative electrode
4—flexible encapsulating coating
5—attachment, filament, mesh, net, wire, fiber, or web-like structure
6—lever
7—lever
8—zone of highly electroactive material, preferably around initial negative electrode
9—universal joint
10—electronic circuit grid board
11—porous coating
12—lever composed of a rigid material
13—cylinder
14—first actuation zone
15—second actuation zone

DETAILED DESCRIPTION OF THE PREFERRED EMBODIMENT(S)

The present invention is based upon the discovery that a novel, superior, highly controllable electroactive actuator is produced capable of fast, pronounced contraction and expansion, by restricting the direction of movement in undesired direction(s) to control and amplify movement in the desired direction(s), using optimized composition(s) of ion-containing electroactive materials, including the incorporation of the acetate of methacrylic acid with its associated cation, the degree of cross-linking of the electroactive material, including the use of one or more different cross-linking agents, the dilution of the monomer mix prior to polymerization, multi-phasic syntheses to give different physical properties in different areas of the electroactive material, the choice of solvent(s), the choice of antifreeze if needed, treatment of the electrodes, the configuration and shape of the electrodes, connection of attachment(s) to the highly electroactive material and to other objects, coating the highly electroactive material, coating the highly electroactive material with a bilayer coating, where the inner bilayer of the coating is conductive and can act as the slightly external electrode and the outer bilayer of the coating is elastomeric and helps retain the moisture and integrity of the highly electroactive material, and coating the highly electroactive material with a trilayer, where the inner most layer forces actuation in the desired direction, the middle layer serves as the negative electrode, and the outmost layer is elastomeric and helps retain the moisture and integrity of the highly electroactive material. The polymer-metal interface of the electrodes and the highly electroactive material is significantly improved by plasma treatment of the electrodes, preferably nitrogen plasma followed by oxygen plasma, using a multi-phasic synthetic approach to tether the electrodes and any attachments where they enter the highly electroactive material, and using shaped embedded electrode(s). The strength of the polymer-metal interface is crucial in any application where movement is encountered, particularly the preferred movements of the instant invention, contraction, and expansion.

The direction of movement in one or more desired directions by restricting the movement in the other undesired direction(s) when using electroactive polymer-based materials and actuators capable of pronounced contraction and expansion produce a highly controlled, fast motion in the desired direction(s). If an increase or decrease in the z-direction is desired, for example, the thickness of the electroactive material or electroactive actuator, then the restriction of movement in the xy-direction is restricted, producing less movement in the xy-plane and pronounced movement in the z-direction. Conversely, if an increase or decrease in the xy-direction is desired, for example, the area of the electroactive material or electroactive actuator, then the restriction of movement in the z-direction is restricted, producing less movement in the z-direction and pronounced movement in the xy-plane.

This can be accomplished by adhering the highly electroactive material to a firm substrate that doesn't change dimension as much as the highly electroactive material, such as a carbon fiber weave, metal wire weave, or a plastic, ceramic, or metal base. Another way to do this is by using selected coating(s), such as using an elastomeric coating that is more flexible in one or more direction than the other direction(s), such as a uniaxially stretched elastomeric coating. The combination of adhering the electroactive material to a firm substrate and using selected coating(s) produces movement that is restricted in one or more directions with extremely pronounced movement in the desired directions(s). Restriction of motion using both adherence of the electroactive material to a firm carbon weave substrate and coating with a uniaxially stretched elastomeric silicone coating improves the speed for rotational actuation from 2 minutes to less than 10 seconds, where the fast rotations can be controlled, repeatedly, back and forth, by simply reversing the electric polarity back and forth. In addition, a combination of controlling both electric input, for example, voltage levels, and restriction of movement in undesired direction(s), produces control of both the amount of movement and the direction of movement in electroactive polymer-based materials and actuators capable of pronounced contraction and expansion.

The electroactive material capable of pronounced contraction and expansion comprises at least one monomer, at least one salt of an ion-containing monomer, controlling the amount of cross-linking of the highly electroactive material, diluting the monomer mix prior to polymerization, swelling the highly electroactive material in appropriate solvent, plasma treating or otherwise treating the electrodes with nitrogen plasma followed by oxygen plasma to improve the metal-polymer interface, optimizing the configuration and shape of the electrodes, attaching fibers or rods if needed to the highly electroactive material and to other objects such as levers, and coating the electroactive material to allow the highly electroactive material and the highly electroactive actuator to operate anywhere. In the synthesis, by blending the acetate of methacrylic acid with its associated cation (Group 1 cation, such as sodium or potassium, or any stable cation) with methacrylic acid, and then cross-linking, the post-synthesis electrolyte induction step is eliminated. This also removes the unnecessary anion, typically chlorine ion, from an electrolyte salt in the final composition. In addition, the final material is extremely electroactive. This high electroactivity allows for stronger cross-linking strategies to be used. Another synthetic strategy is to use more than one cross-linking agent, for example, one cross-linking agent with a functionality of 4 and another cross-linking agent with a functionality of 6, to further improve physical properties such as toughness, leading to greater durability in these highly electroactive materials. This invention provides for materials and actuators that are stronger, tougher, more electroactive, with easier synthesis due to less volatiles during synthesis, and simplified post-synthesis procedures. The electrodes can be plasma-treated metal, based treated, etched, or otherwise treated metal. For even more flexible actuation, carbon fibers, carbon weaves, or carbon felt can be used as electrodes. To produce movement or work, the highly electroactive material of the electroactive actuator is activated by applying electricity through the electrodes. To enhance contraction and expansion, one electrode is embedded in the highly electroactive material, and the other electrode is positioned slightly external to the highly electroactive material, but still in electric contact through the solvent. For contraction, the positive electrode is positioned inside the highly electroactive material and the negative electrode is slightly external to the highly electroactive material. For expansion, the polarity is simply reversed so that the internal electrode is negative and the external electrode is positive. Contraction and expansion in these novel highly electroactive materials can be cycled repeatedly. Because the highly electroactive material undergoes such drastic size changes, several strategies are used to keep the actuator together. A bending, spiral-shaped, or preferably spring-shaped internal embedded electrode greatly improves the durability of the actuator because the metal-electrode can flex as the highly electroactive material changes its dimension. Also, at the distal ends of the highly electroactive actuator, where the internal electrode enters highly electroactive material and where any attachments enter the highly electroactive material, a stronger formulation is provided at the distal ends, to tether the electrodes and any attachments firmly into place where they enter the highly electroactive material. This can easily be done using a multi-phasic synthetic approach, where the distal ends of the actuator are a different formulation, preferably much more cross-linked, than the more central electroactive zone of the actuator. The coating of the actuator can be a bilayer coating, where the inner layer is flexible and conductive so also serves as the slightly external electrode, and the outer layer serves to retain moisture of the highly electroactive material inside, allowing these actuator to be operational anywhere. The coating can be a trilayer coating, where the inner most layer can be used to force actuation in a desired direction, for example, for a linear push-pull actuator. The most inner layer is somewhat stiff and rigid, restricting motion in one plane thus maximizing motion in the desired direction for actuation. This inner layer also helps to retain the integrity of the highly electroactive material of the highly electroactive actuator. This most inner layer of the trilayer coating has small holes or is porous to allow conductive solvent to the middle layer. The middle layer of the trilayer coating serves as the negative electrode. The outer layer of the trilayer coating is elastomeric and helps to retain moisture and integrity of the highly electroactive material of the highly electroactive actuator, allowing the actuator to be operational anywhere. For applications where these novel highly electroactive materials and actuators are subjected to cold environments below the freezing temperature of the solvent, a small amount of antifreeze, such as glycerol or diethylene glycol, can be added to the solvent. The solvent is preferably water. The degree of contraction, and expansion when the polarity is reversed, can be controlled by the voltage level of the electric input, so biofeedback can be linked in using these materials and actuators. The instant invention may revolutionize robots and prostheses by providing highly electroactive materials and highly electroactive actuators that have a smooth two and three dimensional range of motion, good durability, high strength, and that may operate over a wide variety of environmental conditions. The preferred movements of these novel highly electroactive materials and highly electroactive actuators are contraction and expansion, which may allow for human-like robots and prostheses with life-like motion. The highly electroactive actuator can be made in a variety of shapes, sizes, and tendon-like strands. Rotational actuation with these actuators indirectly and directly attached to cylinders, linked actuation with extremely biomimetic designs, and energy efficient tactile haptic screens and pads, for Braille readers and for quiet no-light night mission communication, which are some examples of how useful these novel highly controllable electroactive materials and electroactive actuators capable of pronounced contraction and expansion are in this invention. By combining linked actuation around a simple hinge joint with actuation around a universal joint, also called a ball-and-socket joint, a variety of life-like prosthetic and humanoid robotics can be designed, in addition to other designs with an even wider range of motion. A drug delivery pump that changes its dimension, and thus its drug release profile, with electric input, thereby replacing traditional mechanical pumps, is another application. A cylinder made of this novel highly electroactive material could, after electric input, be very small in diameter, for easy placement in orifices, such as catherization, hearing aid placement, stents, stent placement, drilling, and probing; then once in place, relax to its larger dimension as needed; and then actuated to a small size again with electric input for easy removal. These highly electroactive materials and highly electroactive actuators can be wired for DC current, or with small enough actuators, be responsive to AC current. The embedded electrode in the electroactive material and the outer electrode near the electroactive material can be a shaped electrode, such as a spring, bendable electrode, stretchable electrode, nano-layer, flexible electrode, or shape-changing electrode.

The smaller the electroactive material and electroactive actuator, the faster the proportional motion with a given electric input (Table 2), due to the osmotic effect of solvent that occurs during contraction and expansion. Humans are made up of tiny cells and these tiny cells allow for much faster osmosis than an enormous macro-sized cell. By combining tiny cells together to make a large organism, the speed that occurs at the cellular level allows for the speed of movement observed in large life forms, such as humans. These electroactive materials, electroactive actuators, the associated wiring(s), and associated coating(s) can be miniaturized, even microscopic or nano-scale miniaturization, in order to produce extremely fast contraction or expansion. Lower voltages can be used on the miniaturized actuators to produce rapid movement in these miniaturized actuators. If the actuator is small enough, alternating current can be applied to these miniaturized actuators to produce very rapid contraction and expansion cycles. Shaped current input, such as spiked, sawtooth, or step wave functions, can produce greater control and greater energy efficiency in these actuators. Muscle is composed of actin and myosin filaments arranged into sarcomeres, which are arranged into myofibrils, which are arranged and bundled in muscle fibers, which are bundled together to form muscles. These miniaturized actuators can be bundled together to form larger actuators that are capable of very fast, very strong, very energy efficient, controllable contraction and expansion for extremely life-like biomimetic-linked actuation.

TABLE 2

Expansion and contraction speed as a function of size of electroactive material.

| Sample Size Sample = 152V3 | Weight before expansion cycle (grams) | Weight after contraction cycle, −50 V embedded electrode, 1 min | Expansion | Weight before contraction cycle (grams) | Weight after contraction cycle, +50 V embedded electrode, 1 min | Contraction |
|---|---|---|---|---|---|---|
| Large EAP | 0.82 g | 0.88 | 107% | 0.88 g | 0.77 g | 13% |
| Medium EAP | 0.29 g | 0.33 | 114% | 0.33 g | 0.24 g | 27% |
| Small EAP | 0.12 g | 0.22 | 183% | 0.22 g | 0.12 g | 46% |

A battery or batteries, preferably aligned in series, can be part of the actuation design, allowing the actuator to roam independently. Wireless functionality and remote control can be added to the design to control the movement of the actuators remotely. Films of the highly electroactive material can be used for haptic tactile display/pads and for shape-morphing surfaces, such as for the realistic appearance of goose bumps on synthetic skin and dimpled surfaces for naval, aircraft, and other vehicles.

With the above limitation of the current approaches in mind, it is an object of the present invention to provide a method and system that produces a highly electroactive material and highly electroactive actuator capable of pronounced contraction and expansion where the movement is contraction in addition to other movements such as expansion, bending, flexing, wrinkling, buckling, rippling, or the combination of these movements. Another object of the present invention is to provide a method and system that produces a highly electroactive material and highly electroactive actuator capable of pronounced contraction and expansion that when activated by electricity produces movement or work. Another object of the present invention is to provide a method and system that produces a highly electroactive material and highly electroactive actuator capable of pronounced contraction and expansion that when activated by electricity repeatedly, moves and works repeatedly as a durable cohesive unit. Another object of the present invention is to provide a method and system that produces a highly electroactive material and highly electroactive actuator capable of pronounced contraction and expansion where robots and prostheses have human-like motion. Another object of the present invention is to provide a method and system that produces a highly electroactive material and highly electroactive actuator capable of pronounced contraction and expansion that wrinkles or moves in a way to feel like human skin to the touch. Another object of the present invention is to provide a method and system that produces a highly electroactive material and highly electroactive actuator capable of pronounced contraction and expansion that wrinkles or moves in a way to appear like human skin. Another object of the present invention is to provide a method and system that produces a highly electroactive material and highly electroactive actuator capable of pronounced contraction and expansion that feels warm to the touch. When electricity is applied, heat is generated, and the electroactive material becomes warm.

A fuel cell system can be added close to the highly controllable electroactive actuator so that when the electroactive material is operating above 1.23 volts and thus producing gases in an aqueous solvent, the gases are used by the fuel cell to produce electricity and water, which can be provided back to said highly electroactive actuator. In addition to a novel way of creating life-like biomimetic motion, tying in the electroactive materials and electroactive actuators with fuel cell(s) provides for an extremely energy efficient way to produce this motion.

The instant invention discloses and claims an electroactive actuator comprising a superior highly electroactive material, and a method for producing a said, superior, highly electroactive material comprising at least one ion-containing monomer, at least one salt of an ion-containing monomer, controlling the amount of cross-linking, diluting the monomer mix prior to polymerization, swelling the highly electroactive material in an appropriate solvent, plasma treating, base treating, etching, or otherwise treating the electrodes, preferably of titanium with nitrogen plasma followed by oxygen plasma, attaching fibers or rods if needed to the highly electroactive material, tethering the distal ends where the electrodes and attachments enter the higher electroactive material with a higher matrix formulation, and encapsulating the highly electroactive material, with its electrodes and possibly other fibers or rods, so that it can operate anywhere. The highly electroactive materials and highly electroactive actuators respond by movement, particularly contraction, and conversely expansion, to electricity, and are also strong, tough, resilient materials well suited for use where motion is required, even repetitious use. The electroactive material, also called the smart material, intelligent material, electroactive polymer, or electroresponsive material, comprises of a flexible ion-containing material, such as a polymer comprising ion-containing monomer, such as methacrylic acid and the acetate of methacrylic acid with its associated cation, which can also contain non ion-containing polymers comprising monomers, such as 2-hydroxyethyl methacrylate, vinyl alcohol, or other monomers, cross-linked with poly (ethylene glycol) dimethacrylate or other suitable cross-linking agents, such as diurethane dimethacrylate, 1,1,1-trimethylolpropane trimethacrylate, ethylene glycol dimethacrylate, or a combination of cross-linking agents. Other electroactive polymers may also be used as the electroactive material on as a component of the electroactive material, such as ionized poly(acrylamide), poly(acrylic acid), poly(acrylic acetate), poly (acrylic acid)-co-poly (acrylamide), poly(2-acrlyamide-2-methyl-1-propane sulfonic acid), poly(methacrylic acid), poly(methacrylic acetate), poly(2-hydroxyethyl methacrylate), poly(vinyl alcohol), poly(styrene sulfonic acid), quartemized poly(4-vinyl pyridinium chloride), poly(vinylnbenzyltrimethyl ammonium chloride), sulfonated poly(styrene), or materials that respond to electricity by movement, expansion, contraction, curling, bending, buckling, or rippling. The preferred highly electroactive material comprises the monomer methacrylic acid and the acetate of methacrylic acid, sodium salt, polymerized and cross-linked, preferably with the cross-linking agent poly(ethylene glycol) dimethacrylate, cross-linked at a low level, less than 5.0 mole percent with respect to methacrylic acid and methacrylic acetate, preferably cross-linked within a range of 0.30 to 2.5 mole percent poly(ethylene glycol) dimethacrylate with respect to methacrylic acid and methacrylic acetate, and preferably initiated with the photo-initiator 1-hydroxycyclohexylphenyl ketone, also called Irgacure 184®, in a concentration of 0.42 mole % with respect to methacrylic acid and methacrylic acetate. Prior to polymerization, the monomers, cross-linking agent(s), and initiator are diluted with a solvent compatible with the ion-containing monomers, preferably distilled water. Ultraviolet light radiation is preferably used to induce polymerization, but heat induced free radical polymerization using 2,2'-azodiisobutyronitrile (AIBN) or other free radical initiators can also be used. AIBN is especially useful when a foam is desired for the final electroactive material. Light induced polymerization is considered one of the most efficient techniques for rapidly producing polymeric materials with well-defined characteristics, particularly for cross-linked networks. Photopolymerization is often the method of choice for rapid, assembly style, through-put polymerizations. Three-dimensional printing using visible or ultraviolet light can be used to create customized designs for these highly controllable electroactive materials and electroactive actuators capable of pronounced contraction and expansion. Visible light induced radiation using a suitable photo-initiator, such as phenylbis(2,4,6-trimethylbenzoly)phosphine oxide, also called Irgacure 819®, has also been used with good results. Gamma radiation can also be used to polymerize these novel materials. Gamma radiation initiated polymerization is useful when the addition of an initiator is undesirable, or if the polymerization batch absorbs light too much because of pigments or because of the monomer being impregnated into porous materials. Gamma radiation is also used for sterilization purposes. Gamma radiation may be the polymerization mechanism of choice for polymers that must also be microbially sterile. Once polymerized and cross-linked, the electroactive material can be further swollen in a compatible solvent, preferably water, but electrolyte solution also works well. Plasma treating, such as nitrogen plasma treatment, oxygen plasma treatment, argon plasma treatment, or preferably nitrogen plasma treatment followed by oxygen plasma treatment, or otherwise treating the preferably titanium-based electrodes, produced an improved metal-polymer interface, which is crucial for the success of the highly electroactive actuator because of the pronounced movements of the highly electroactive material(s). Because these novel highly electroactive materials undergo such drastic size changes, several more strategies are used to keep the actuator together in the current invention.

A bending, spiral-shaped, or preferably spring-shaped internal embedded electrode greatly improves the durability of the actuator because the metal electrode can flex as the highly electroactive material changes its dimension. For applications where high flexibility of actuation is needed, carbon fibers, carbon weaves, and carbon felts adhere well to these novel highly electroactive materials. At the distal ends of the actuator, where the internal electrode(s) enters the highly electroactive material and where any attachment(s) enters the highly electroactive material, a stronger formulation is provided, preferably with higher cross-linking, at the distal ends compared to the more central area of the electroactive material. This multi-phasic synthetic approach tethers the electrodes and any attachments firmly into place where they enter the highly electroactive material, analogous to muscle tissue having tendons that attach to bone. By placing the positive electrode inside the highly electroactive material described, and having the negative electrode slightly external to the highly electroactive material, with suitable conduction through conductive solvent, such as distilled water with a slight amount of salt present or water containing metal and other ions, such as tap water, and applying electric input, contraction occurs. When the polarity of the electrodes is reversed, expansion occurs. Contraction and expansion can be cycled repeatedly. The ends of the electrodes in or near the highly electroactive may be splayed, untwisted, arranged into one or more filaments, meshes, nets, wires, or fibers. Covering the outer surface of the highly electroactive material with one or more coating(s) of elastomeric material allows for the electroactive material to be removed from immersion in compatible solvent or electrolyte solution and operational in a variety of environments. The coating of the actuator in this invention can be a bilayer coating, where the inner layer is flexible and conductive so also serves as the slightly external electrode, and the outer layer serves to retain moisture of the highly electroactive material inside. The coating of the highly electroactive actuator can be a trilayer coating, where the inner most layer restricts motion in one direction thus maximizing motion in the desired direction for actuation and helps to retain the integrity of the highly electroactive material. This most inner layer of the trilayer coating has small holes or is porous to allow conductive solvent to the middle layer. The middle layer of the trilayer coating serves as the negative electrode. The outer layer of the trilayer coating is elastomeric and helps to retain moisture and the integrity of the highly electroactive material of the highly electroactive actuator, allowing the actuator to be operational anywhere. For applications where these novel highly electroactive materials and highly electroactive actuators are subjected to cold environments, a small amount of antifreeze, such as glycerol or diethylene glycol, can be added to the solvent. The solvent is preferably water. The described composition, method, and configuration of the highly electroactive material and highly electroactive actuator, with electrodes, and sealed with protective, elastomeric coating(s), acts as an artificial muscle within a protective "skin," where the electrodes serves as "nerves" delivering the electric impulse to the highly electroactive material of the highly electroactive actuator, and the electrodes can also serve as "tendons" independently or with other materials to connect the highly electroactive material(s) of the highly electroactive actuator(s) to levers, joints, valves, mechanical devices, toys, or other objects. Carbon particles, fibers, felts, weaves, nano-particles, or nano-tubes, metal ions, or any other electrically conductive material, may be included in the highly electroactive material to enhance its electroactivity. Fibers, weaves, felts, or other materials may be attached to the highly electroactive material(s) and to levers, hinges, joints, valves, or other objects to produce movement and work, in conjunction with or independent of the electrodes. The embedded electrode, which can be spiral or spring-shaped, can also have a spiral-shaped highly electroactive polymer around it, providing good linear actuation. Alternatively, a spiral-shaped highly electroactive polymer can be spiral shaped around a (straight) wire, rather than direct embedment, providing linear actuation. The highly electroactive material or the highly electroactive actuator may be used individually or grouped together in fibers, bulk, slabs, bundles, or other configurations to hinge joints, rotator (ball-and-socket) type joints, other joints, other hinges, hole-filling applications, hole-plugging applications, valves, catheters, stents, levers, other objects, or anywhere movement or work is required. To produce movement or work, the highly electroactive material of the highly electroactive actuator is activated by electricity, the highly electroactive material of the electroactive actuator relaxes or returns to its original conformation after the electricity is stopped, the polarity of the electrodes is reversed, or a combination of movements from activation and relaxation or from reversing the polarity of the electrodes. The degree of contraction, and expansion when the polarity is reversed, can be controlled by the voltage level of the electric input, so biofeedback could easily be linked in using these materials and actuators. An example of using a combination of movements is to arrange, place, or configure the highly electroactive materials or highly electroactive actuators as antagonistic pairs, similar to how muscles are arranged around joints. Antagonistic pairs are utilized to grip and hold as thumb and fingers do. By optimizing the highly electroactive material(s) and highly electroactive actuator(s) in terms of electroactivity, electrode configuration, mode of movement, and physical properties, electroactive materials and electroactive actuators may be designed for various applications, such as prostheses, robots, automation, toys, catheters, stents, devices that fly, swim, walk, run, climb, stretch, swing, grasp, or use a combination of motions, valves, medical applications, industrial applications, or anywhere movement, particularly contraction or expansion, is desired. A thin layer of the highly electroactive material may also function as human-like fascia, perimysium, epimysium, and skin that even wrinkles. When electricity is applied, heat is generated, and the electroactive material becomes warmer, which makes it feel warm to the touch.

Examples of the test procedure used follow.

Example 1

Tests are conducted by placing the preferred ingredients of the composition for the highly electroactive material into vials or test tubes of sufficient volume to accommodate the size of the of the electroactive polymer desired, then the vial or test tube is shaken by hand, although stir bars or other mechanisms may be used. The vial or test tube sizes are from 10 mm to 15 mm in diameter. Tubing of 5 mm in diameter or less, 3-D printing, or electro-spinning is used when strands for tendon-like material are desired. The ingredient mixtures are purged with an inert gas such as nitrogen, helium, or argon prior to polymerization to exclude oxygen. Oxygen inhibits excited state and free radical polymerizations. Polymerization is conducted using ultraviolet (UV) induced excited state photo-initiation and can also use thermal free radical initiation, visible light induced photo-initiation, or gamma radiation initiation.

Example 2

For example, in a vial, methacrylic acid (linear functionality equals 2), acetate of methacrylic acid, sodium salt (linear functionality equals 2), poly(ethylene glycol) dimethacrylate (cross-linking agent, functionality equals 4), UV initiator such as 1-hydroxycyclohexyl phenyl ketone, visible light initiator such as phenylbis(2,4,6-trimethylbenzoly) phosphine oxide, or thermal free radical initiator such as 2,2-azobisisobutyronitrile or benzoyl peroxide, and water or glycerol as the solvent. The vial is purged with inert gas to remove oxygen. Then the vial is typically stirred by swirling by hand, and polymerizing to gelation using UV or visible light for excited state photo-polymerizations, heat for free radical polymerizations, or gamma radiation for excited state polymerizations. The preferred composition for the electroactive material 1 is a blend of methacrylic acid and the actetate of methacrylic acid with its associated cation such as sodium ion, or preferably, potassium salt as its associated cation, other suitable ion-containing monomers, with or without 2-hydroxyethyl methacrylate or other non-ionic monomers, cross-linked with poly(ethylene glycol) dimethacrylate, or other suitable cross-linking agents, such as diurethane dimethacrylate, ethylene glycol dimethacrylate, 1,1,1-trimethylolpropane trimethacrylate, or a combination of cross-linking agents, preferably at a low level of cross-linking, preferably within a range of 0.20 10 mole percent poly(butanediol) dimethacrylate ($<M_n> \sim 600$ g/mole) with respect to methacrylic acid and methacrylic acetate. Silicone based cross-linking agents can be used to improve physical properties of the electroactive material. More than one cross-linking agent can be used, such as a bimodal cross-linking strategy using two different cross-linking agents, to improve physical characteristics. These materials are produced using standard free radical polymerization, photo-polymerization, or gamma polymerization methods, preferably in the presence of solvent(s), preferably a solvent compatible with the monomer(s) such as water, glycerol, or organic alcohol(s). Prepolymers or oligomers may also be used. Cross-linking greatly improves the resilience, toughness, and in some cases, strength, of the electroactive materials, and within a defined range, may optimize the electroactive movement of contraction or expansion. A variety of materials may comprise the highly electroactive material, such as poly(vinyl alcohol), ionized poly(acrylamide), poly(acrylic acid), poly(acrylic acetate), poly(acrylic acid)-co-(poly(acrylamide), poly(2-acrylamide-2-methyl-1-propane sulfonic acid), poly(methacrylic acid), poly(styrene sulfonic acid), quaternized poly(-vinyl pyridinium chloride), and poly(vinylbenzyl trimethylammonium chloride), sulfonated poly(styrene-b-ethylene)-co-poly (butylene-b-styrene), sulfonated poly(styrene), or any material that responds to electricity by movement, contraction, expansion, curling, bending, buckling, or rippling.

Example 3

By adhering a thick film of the highly electroactive material on a firm substrate, such as a carbon weave, which can also serve as the initial positive electrode, and having the initial negative electrode near the electroactive material, with appropriate conductive solvent, all encapsulated in an elastomeric silicone film. With electric input, restriction in the xy-plane (area) from the electroactive material being stuck to the carbon weave or other firm substrate, produces amplified movement in the z-direction (thickness).

Example 4

By adhering a two thick films of the highly electroactive material to two firm substrates, such as two pieces of carbon weave, where the carbon weave pieces serve as the initial positive electrode and the initial negative electrode, with appropriate conductive solvent, all encapsulated in an elastomeric silicone film. With electric input, restriction in the xy-plane (area) from the electroactive material being stuck to the carbon weave or other firm substrate, produces amplified movement in the z-direction (thickness). With the two zones, receiving opposite electric input, one zone significantly increases in thickness while the other zone significantly decrease in thickness, providing fast leverage, in a seesaw fashion. By directly attaching the actuator to the ball or cylinder, by adhesion or tying with string, the ball or cylinder can easily be rotated with electric input, where the amount of movement can be controlled by the voltage level, and the direction of movement can be controlled by the polarity of the electric input.

The preferred composition for the electroactive material 1 is a blend of methacrylic acid and the actetate of methacrylic acid with its associated cation such as sodium ion, preferably with potassium as its associated cation, or other suitable ion-containing monomers, with or without 2-hydroxyethyl methacrylate or other non-ionic monomers, cross-linked with poly(ethylene glycol) dimethacrylate, or other suitable cross-linking agents, such as diurethane dimethacrylate, ethylene glycol dimethacrylate, 1,1,1-trimethylolpropane trimethacrylate, or a combination of cross-linking agents, preferably at a low level of cross-linking, preferably within a range of 0.30 to 2.5 mole percent poly(ethylene glycol) dimethacrylate ($<M_n> \sim 330$ g/mole) with respect to methacrylic acid and methacrylic acetate. These materials are produced using standard free radical polymerization, photopolymerization, or gamma polymerization methods, preferably in the presence of solvent(s), preferably a solvent compatible with the monomer(s) such as water, glycerol, or organic alcohol(s). Prepolymers or oligomers may also be used. Cross-linking greatly improves the resilience, toughness, and in some cases, strength, of the electroactive materials, and within a defined range, may optimize the electroactive movement of contraction or expansion. A variety of materials may comprise the highly electroactive material, such as poly(vinyl alcohol), ionized poly(acrylamide), poly(acrylic acid), poly(acrylic acetate), poly(acrylic acid)-co(poly(acrylamide), poly(2-aciylamide-2-methyl-1-propane sulfonic acid), poly(methacrylic acid), poly(styrene sulfonic acid), quaternized poly(-vinyl pyridinium chloride), and poly(vinylbenzyl trimethylammonium chloride), sulfonated poly(styrene-b-ethylene)-co-poly(butylene-b-styrene), sulfonated poly(styrene), or any material that responds to electricity by movement, contraction, expansion, curling, bending, buckling, or rippling.

Another attribute of the highly electroactive materials and highly electroactive actuators, which are capable of contraction and expansion, is that the amount of contraction can be controlled by the amount of electric input simply by adjusting the voltage. Table 3 shows the amount of contraction, or expansion when the polarity is reversed, depends upon the amount of voltage applied for a given time period. This can be applied using a combination of high and low voltages as well. Controlling the applied voltage in these highly electroactive materials and actuators could be very useful for creating motor function. It is very important for muscles to be able to partially contract, for example, to be able to hold an egg with one's fingers without breaking it. If muscles could only completely contract, nobody could hold an egg without breaking it. A combination of high and low voltages could produce gross and fine motor skills, respectively, providing both large motor control and fine motor control (fine manipulation) within the same actuator unit. The ability to control the amount of electroactive actuation by the amount of electric input in these highly electroactive materials and actuators can be tied in with biofeedback.

TABLE 3

Control of amount of contraction or expansion by voltage level

| Experimental conditions for highly electroactive polymer (EAF) material comprising cross-linked poly(methacrylic acid)-co-poly(methacrylic acetate, sodium salt) | % Change from original weight | % Contraction or Expansion |
|---|---|---|
| Positive electrode embedded in EAP, 60 seconds, 5 V | 92% (contraction) | 8% contraction |
| Positive electrode embedded in EAP, 60 seconds, 15 V | 86% (contraction) | 14% contraction |
| Negative electrode embedded in EAP (reverse polarity), 60 seconds, 5 V | 105% (expansion) | 5% expansion |
| Negative electrode embedded in EAP (reverse polarity), 60 seconds, 15 V | 144% (expansion) | 44% expansion |

The electrodes are preferably titanium based, but may be any suitably conductive material. The ends of the electrodes are preferably splayed, untwisted or arranged into one or more filaments, meshes, nets, wires, or fibers, and may be plasma treated, base treated, etched, or otherwise treated, preferably with nitrogen plasma, oxygen plasma, or a combination such as nitrogen plasma followed by oxygen plasma. Because the monomer mix is ionic, a hydrophilic metallic surface is desired for good metal-polymer adhesion. Using the nitrogen, oxygen, and synthetic air plasma treatment improves the polymer-metal interface, particularly for titanium; however, using oxygen plasma has many safety considerations. For applications where a great deal of flexibility is desired, carbon fibers, meshes, weaves, or felts can be used as electrodes.

The splayed, untwisted, or arranged ends of the electrodes, which are preferably plasma-treated titanium, are then placed into position, preferably but not necessarily, in a mold prior to the polymerization and cross-linking of the highly electroactive material. The positive electrode is preferably in the electroactive material to a greater degree than the negative electrode, where the negative electrode may even be external to the electroactive material. After polymerization and cross-linking, the highly electroactive material is then allowed, if needed, to absorb solvent, such as water, glycerol, diethylene glycol, organic alcohol(s), or any conductive liquid, and preferably water.

The coating(s), covering(s), or encapsulation(s), comprise any suitable elastomer, such as natural rubber, poly(butadiene), poly(vinylidene chloride), silicone, selected polyurethanes, VHB tape, Press'n Seal®, Tesa Tape®, shrinkwraps, or combination of materials, which can be coated, sputter coated, or otherwise encapsulated around the highly electroactive material, parts of the electrodes, and possibly other connective fibers protruding from the electroactive material. The coating(s) can be a bilayer, where the inner layer of the bilayer coating serves as a negative electrode, slightly external to the electroactive material (but still in electric contact through conductive solvent) and the outer layer of the bilayer coating is any suitable elastomer, or a trilayer, where the inner most layer forces actuation in the desired direction, the middle layer serves as the negative electrode, and the outmost layer is elastomeric and helps retain the moisture and integrity of the highly electroactive material.

Shaped electrodes, such as bending, spiral, or preferably spring-shaped electrodes can be used for the embedded electrode(s), which can flex when the highly electroactive material is actuated. Also, a higher matrix formulation can be used at the distal ends of the electroactive material of the electroactive actuator, where the electrode(s) and any attachment(s) enter the electroactive material. The formulations at the distal ends of the electroactive material are preferably poly(methacrylic acid) cross-linked with at least 5 mole percent cross-linking agent with respect to linear (functionality=2) monomer(s). Other cross-linking strategies, polymers, glues, tapes, or adhesives can also be used to tether the embedded electrode(s) and any attachment(s) into place.

The highly electroactive material operates when electricity flows through the electrodes, which causes the material to move, expand, curl, bend, ripple, buckle, or preferably, contract. By optimizing the composition of the highly electroactive material and the configuration of the electrodes, a highly electroactive material was developed that contracts over 50% from original its weight within 30 seconds at fifty volts, and when the polarity is reversed, expands over 150% from its original weight within 30 seconds at fifty volts. When the electricity is stopped, the highly electroactive material relaxes back to its original conformation. The polarity of the electrodes may be reversed to expedite the highly electroactive material back to its original conformation or to cause another mode of movement, such as contraction or expansion, or any combination of movements may be used. An example of combining movements is to arrange, place, or configure the highly electroactive materials or highly electroactive actuators as antagonistic pairs, similar to how muscles are arranged around joints.

Using 2 zones of actuation and 4 zones of actuation around a simple hinge joint, these novel highly electroactive actuators moved two links closer together and then when the electric polarity of the actuators was reversed, moved the two links farther apart. For linked actuation, multiple zones can be used, preferably in pairs working together. Human muscles only contract. Highly electroactive materials and highly electroactive actuators can contract and expand. Using both modes of actuation simultaneously provides for good strength and allows for very efficient, streamlined designs.

The universal joint is also known as a ball-and-socket joint. Highly electroactive materials and actuators, when attached to a universal joint, preferably with three or more actuators, allows for a large range of motion. Devices using links with levered hinge joints and universal joints can produce a robots and prostheses with an extremely wide range of motion. Life-like prosthetics and humanoid robotics are relatively easy to design using these highly electroactive materials and actuators.

As illustrated in FIG. 8, rotational actuation was implemented by directly attaching a two-zone electroactive actuator to the cylinder. The two zones used contraction and expansion simultaneously, where one zone contracted while the other zone expanded, amplifying the overall movement. The cylinder could be rotated back and forth by simply switching the electric polarity of the embedded electrodes in each zone. For the directly attached two zone rotational actuation, rotation was slow in the first attempts. By restricting movement in the xy-directions (area), allowing for movement only in the z-direction (thickness), rotation was much faster. This was done by adhering the electroactive material to a carbon weave, where the conductive carbon weave also served as the electrode(s). This strategy increased the rotation speed from 2 minutes to 1 minute. By also coating the 2-zone actuator with a flexible silicone thin film that was stiffer in the xy-directions and much more flexible in the z-direction, in other words, a uniaxial stretched thin film, provided for good rotational actuation within 4 to 11 seconds, back and forth, repeatedly. A variety of cylinders were rotated using these small electroactive actuators. Human muscle output—the weight of one's muscles to one's total weight plus what they can move, carry, push, or pull—is roughly 1:10. A 13.5 g 40 mm cylinder was rotated using a 1.5 g electroactive actuator, for a total weight of 15 g. This is a mass ratios of 1:9 actuator to cylinder and 1:10 actuator to total weight. The force generated to move 15 g approximately one inch (2.5 cm) within four seconds is 24 mN. The amount of contraction and expansion, and thus the speed of rotation, can be controlled by adjusting the voltage level. Lower voltage, 15 volts, produced a slower, more controlled movement than the faster rotations at 50 volts. Fast actuation using these 2 zone actuators was also performed on a small 12 mm cylinder and a large 95 mm cylinder. Again, one zone expands while the other zone contracts, causing the cylinder to roll. These were also fast rotations, within seconds, first to the left, and then with reverse electric polarity, rotation to the right. For the 95 mm in diameter cylinder, weighing 33.5 g, the weight ratios, using a 2 g electroactive actuator to rotate the large cylinder was 1:17 actuator to cylinder and 1:18 actuator to total weight. This is almost double the output that humans can achieve, which is not unexpected. Human muscle only contracts. These novel, highly electroactive materials and highly, electroactive actuators can both contract and expand, and both modes were used simultaneously to perform rotational actuation. For rotational actuation, multiple zones around the cylinder can be added to further the rotation around the entire cylinder. This actuation can be applied to balls and other shapes.

In certain embodiments, the actuation zones and the object to be rotated are in direct contact and thus the expansions and contractions of the actuation zones rotate the object (see, e.g., FIG. 8). In certain embodiments, the two actuation zones each have a longest dimension along an axis, and the two axes are at an angle θ, where 0<θ<180 degree. In these embodiments, the two actuation zones may form a "V" shape and are each in contact with the object to be rotated.

Rotational actuation was implemented using two porous gel pouches containing the highly electroactive material, placed below a lever (which acts like a seesaw), with the cylinder on top. The two pouches used contraction and expansion simultaneously, where one pouch contracted while the other pouch expanded, amplifying the overall movement. For both designs, the cylinder could be rotated back and forth by simply switching the electric polarity of the embedded electrodes in each gel pouch. This actuation can be applied to balls and other shapes. Battery packs can be added to devices using highly electroactive materials and highly electroactive actuators so that these devices can roam independently. Batteries aligned in series and in parallel were applied to these electroactive materials and electroactive actuators capable of pronounced contraction and expansion. The batteries aligned in series produced 4.5 volts and approximately 2 amps. The batteries arranged in parallel produced 1.5 volts and approximately 2 amps. Contraction-expansion steps were cycled back and forth, with each step lasting two minutes using an electroactive material capable of pronounced contraction and expansion. Batteries aligned in series, which increased the voltage, provided significantly better EAP contraction, and expansion when electric polarity reversed (327% expansion from previous step), compared to batteries aligned in parallel (123% expansion from previous step). Batteries aligned in parallel, however, can extend overall battery life. Wireless and remote control can be used to control and guide actuation remotely.

The highly electroactive materials and highly electroactive actuators capable of pronounced contraction and expansion of this invention act as artificial muscle, also known as synthetic muscle. These electroactive materials and actuators may move in two and three dimensions by arranging the highly electroactive material itself or the highly electroactive actuator, individually or grouped together, in fibers, bulk, slabs, bundles, or other configurations, to hinge joints, rotator (ball-and-socket) type joints, other joints, other hinges, hole-filling applications, hole-plugging applications, valves, catheters, stents, levers, or other objects, to produce movement or work when the highly electroactive actuator is activated by electricity, when the highly electroactive actuator relaxes or returns to its original conformation after the electricity is stopped, when the polarity of the electrodes is reversed, or a combination of movements from activation and relaxation or from reversing the polarity of the electrodes. The novel, superior, highly electroactive material and highly electroactive actuator of this invention may have an enormous impact on prostheses, valves, and automated systems, particularly robots, by providing for a smooth two and three-dimensional range of motion, good durability, high strength, and a mode of movement, namely contraction, that allows for human-like prosthetic and robotic designs with life-like motion and feel.

Alternative embodiments of practicing the invention, but within the spirit thereof, will in light of this disclosure, occur to persons skilled in the art. It is intended that this description be taken as illustrative only, and not be construed in any sense except by the following claims.

What is claimed:

1. An actuation device for rotating an object, comprising:
a first actuation zone comprising a first electroactive material;
a first electrode in electronic communication with the first electroactive zone;
a second actuation zone comprising a second electroactive material; and
a second electrode in electronic communication with the second electroactive zone and the first electrode;
wherein
the first and second actuation zones are each in direct contact with the object to be rotated and configured to exert a force on the object upon actuation; and
the first and second electroactive materials are the same or different materials each selected to be capable of pronounced contraction and expansion.

2. The actuation device of claim 1, wherein the first and second electroactive materials each comprises at least one ion-containing monomer cross-linked by at least one cross-linking agent having a functionality of 3 or greater and at least one diluent compatible with the ion-containing monomer.

3. The actuation device of claim 1, wherein
the first electroactive material is adhered to the first electrode which does not change dimension as much as the first electroactive material to restrict its movement in one or more undesired directions to amplify its movement in one or more desired directions; or
the first actuation zone further comprises an elastomeric coating more flexible in one or more desired directions than one or more other undesired directions and covering the first electroactive material to restrict its movement in undesired directions to amplify its movement in the one or more desired directions.

4. The actuation device of claim 1, wherein
the second electroactive material is adhered to the second electrode which does not change dimension as much as the second electroactive material to restrict its movement in one or more undesired directions to amplify its movement in one or more desired directions; or
the second actuation zone further comprises an elastomeric coating more flexible in one or more desired directions than one or more other undesired directions and covering the first electroactive material to restrict its movement in undesired directions to amplify its movement in the one or more desired directions.

5. The actuation device of claim 1, wherein the first and second actuation zones each have a longest dimension along first and second axes, respectively, and the first and second axes are at an angle $\theta$, and $0<\theta\le180$ degree.

6. The actuation device of claim 5, wherein $120<\theta\le180$ degree.

7. The actuation device of claim 1, wherein the first electrode is a positive electrode and the second electrode is a negative electrode.

8. The actuation device of claim 1, wherein the first electrode is a negative electrode and the second electrode is a positive electrode.

9. The actuation device of claim 1, wherein the first and/or second electroactive materials are adhered to the first electrode which does not change dimension as much as the first electroactive material to restrict its movement in one or more undesired directions to amplify its movement in one or more desired directions.

10. The actuation device of claim 1, wherein the first and/or second actuation zones further comprise an elastomeric coating more flexible in one or more desired directions than one or more other undesired directions and covering the first electroactive material to restrict its movement in undesired directions to amplify its movement in the one or more desired directions.

11. The actuation device of claim 10, wherein the elastomeric coating is an uniaxially stretched silicone film.

12. The actuation device of claim 1, wherein the first and/or second electrodes are inserted, embedded, or arranged into the first and/or second actuation zones, respectively.

13. The actuation device of claim 1, wherein the object is a cylinder or a ball.

14. The actuation device of claim 1, wherein the first and/or second actuation zones are configured to be attached to the object.

15. The actuation device of claim 1, wherein the first and/or second actuation zones are configured to be attached to the object by adhesives or string.

16. The actuation device of claim 1, wherein the first and second electrodes are configured to have voltages such that when the first electroactive material contracts, the second electroactive material expands, and when the first electroactive material expands, the second electroactive material contracts.

17. The actuation device of claim 1, wherein the first and/or second electroactive materials have a shape selected from the group consisting of spherical, cylindrical, conical, pyramidal, prism-shaped, spheroid, ellipsoid, cubical, rectangular prism-shaped, toroid, parallel-epiped-shaped, rhombic prism-shaped, and any combination thereof.

18. The actuation device of claim 1, wherein the first and/or second actuation zones have a shape selected from the group consisting of spherical, cylindrical, conical, pyramidal, prism-shaped, spheroid, ellipsoid, cubical, rectangular prism-shaped, toroid, parallel-epiped-shaped, rhombic prism-shaped, and any combination thereof.

19. The actuation device of claim 1, wherein the first and/or second actuation zones further comprise a solvent, an electrolyte solution, an electrolyte gel formulation, carbon particles, fibers, weaves, felts, nano-particles, nano-tubes, or metal ions.

20. The actuation device of claim 1, further comprising one or more additional actuation zones each comprising an electroactive material comprising at least one ion-containing monomer cross-linked by at least one cross-linking agent having a functionality of 3 or greater.

* * * * *